United States Patent
Gao et al.

(10) Patent No.: US 10,485,143 B2
(45) Date of Patent: Nov. 19, 2019

(54) COLD PLATE ASSEMBLY FOR SERVER LIQUID COOLING OF ELECTRONIC RACKS OF A DATA CENTER

(71) Applicant: Baidu USA LLC, Sunnyvale, CA (US)

(72) Inventors: Tianyi Gao, Santa Clara, CA (US); Yan Cui, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/917,570

(22) Filed: Mar. 10, 2018

(65) Prior Publication Data

US 2019/0281730 A1   Sep. 12, 2019

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/20254* (2013.01); *H05K 7/20272* (2013.01)

(58) Field of Classification Search
CPC ........... H05K 7/20781; H05K 7/20254; H05K 7/142; H05K 7/20272; H05K 7/1489; H01L 2924/0002; H01L 23/473; H01L 23/4006; G06F 1/184
See application file for complete search history.

(56) References Cited

U.S. PATENT DOCUMENTS

| | | | |
|---|---|---|---|
| 4,981,405 A * | 1/1991 | Kato | F16B 21/02 24/297 |
| 5,730,210 A * | 3/1998 | Kou | H01L 23/4006 165/80.3 |
| 5,870,286 A * | 2/1999 | Butterbaugh | H01L 23/4093 165/80.2 |
| 7,318,322 B2 * | 1/2008 | Ota | H05K 7/20781 62/259.2 |
| 7,990,715 B2 * | 8/2011 | Chen | H01L 23/4093 165/185 |
| 9,320,176 B2 * | 4/2016 | Tang | H05K 7/20772 |
| 2008/0158827 A1 * | 7/2008 | Yang | H01L 23/4093 361/719 |
| 2010/0053904 A1 * | 3/2010 | Chen | H01L 23/4093 361/720 |
| 2010/0128431 A1 * | 5/2010 | Eriksen | G06F 1/20 361/679.47 |

(Continued)

*Primary Examiner* — Abhishek M Rathod
(74) *Attorney, Agent, or Firm* — Womble Bond Dickinson (US) LLP (57) ABSTRACT

A cooling module assembly includes a cold plate to be positioned adjacent to an exterior surface of a processor to receive heat radiated from the processor, and a cold plate mounting bracket attached to the cold plate to mount the cold plate onto the processor. The cold plate mounting bracket includes a first set of mounting slots to be aligned with a second set of mounting slots disposed on a processor mounting bracket that mounts the processor. Each of the mounting slots in the first set and the second set is configured in an asymmetric shape. The first and second sets of mounting slots allow a mounting pin to be inserted through in a first angle and to rotate from the first angle to a second angle after the insertion to interlock the cold plate with the exterior surface of the processor with proper mounting pressure loaded.

20 Claims, 10 Drawing Sheets

(56) References Cited

U.S. PATENT DOCUMENTS

| | | | | |
|---|---|---|---|---|
| 2010/0330824 A1* | 12/2010 | Ulen | ............ | H05K 7/1053 |
| | | | | 439/73 |
| 2012/0162923 A1* | 6/2012 | Lee | ............ | H01L 23/32 |
| | | | | 361/719 |
| 2013/0343005 A1* | 12/2013 | David | ............ | H05K 13/00 |
| | | | | 361/721 |
| 2014/0092573 A1* | 4/2014 | Llapitan | ............ | H05K 3/301 |
| | | | | 361/772 |
| 2015/0116956 A1* | 4/2015 | Yasutomi | ............ | H01L 23/10 |
| | | | | 361/747 |
| 2016/0120071 A1* | 4/2016 | Shedd | ............ | H05K 7/20772 |
| | | | | 361/679.47 |
| 2017/0009931 A1* | 1/2017 | Knealing | ............ | B60K 5/1283 |

\* cited by examiner

COLD PLATE ASSEMBLY FOR SERVER LIQUID COOLING OF ELECTRONIC RACKS OF A DATA CENTER

FIELD OF THE INVENTION

Embodiments of the present invention relate generally to data centers. More particularly, embodiments of the invention relate to a cold plate design for servers of a liquid cooling system for electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Power intensive processors enable the solution of intensive computing such as deep learning. Electrical servers having those processors, i.e., high-power central processing units (CPUs) and/or general-purpose or graphical processing units (GPUs), have a very high power density per volumetric space, and hence, traditional simple air cooling is very challenging. Direct-to-chip liquid cooling provides a better cooling performance for those power-intensive processors, and saves energy consumption compared to an air-cooling only approach.

Typically, liquid cooling is provided to a processor using a cold plate attached onto an external surface of the processor. Cooling liquid is distributed through the cold plate to exchange heat generated from the processor. Similar to a heat sink, thermal interface material may be used to fill the gaps in the surfaces of the device and the cold plate. The cold plate should be fully in contact with the processor to enable the cold plate to function properly. Without proper contact, the cold plate may not be able to as it is designed or it may fail. This requires a proper mounting pressure. However, if the cold plate mounting pressure is too much, it may cause potential damage to the processor. There has been a lack of efficient ways to mount a cold plate onto a processor with proper pressure without causing damage to the processor.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an innovative mechanical design for a cold plate is used in liquid cooling. The design provides means to quickly, efficiently, and safely assemble and disassemble the cold plates to the chips without requiring any tool. This mechanism also provides a novel design to ensure a proper mounting pressure can be loaded to the cold plate and to the chip/processor. The goal is to ensure that the cold plate base surface is fully in contact with the processor (eliminating the thermal resistance and at the same time meeting the mounting pressure requirements). When to disassemble the cold plates from the motherboards, devices or chips, (for example, replacing the cold plate or the GPU card), this design enables disassembling the cold plate quickly without requiring any tool.

In one embodiment, mounting pins and mounting brackets are utilized to mount a cold plate on a particular location of a printed circuit board (PCB) or motherboard. The function of mounting brackets and mounting pins are to mount a cold plate onto the motherboard easily. This enables the cold plate to be mounted on all horizontal directions. Pressure is loaded by an operator to the cold plate to enable a fully contact with a surface of a processor. It only requires the operator to push the cold plate from the top. The required mounting pressure is provided by the mounting pins and the associated springs. The main pressure is provided by at least two or four mounting pins and the associated springs. Once the mounting pressure is loaded to the cold plate and the processor, the spring provides and maintains a proper pressure. The cold plate can be easily disassembled by releasing the mounting pins, for example, by rotating the mounting pins from a locked position to an unlocked position.

According to one aspect of the invention, a cooling module assembly (also referred to as a cold plate assembly) for cooling a processor of a data processing system includes a cold plate (e.g., a heat sink with a water fin) to be positioned adjacent to an exterior surface of a processor to receive heat radiated from the processor. A liquid distribution channel formed within the cold plate to distribute a cooling liquid through the cold plate to exchange the heat carried by the cold plate. The liquid distribution channel includes an ingress port (also referred to as an inlet) to be coupled a liquid supply line to receive the cooling liquid from an external liquid source and an egress port (also referred to as an outlet) to be coupled to a liquid return line to return the cooling liquid having the exchanged heat back to the external liquid source.

In one embodiment, the cooling module assembly further includes a cold plate mounting bracket attached to the cold plate to mount the cold plate onto the external surface of the processor. The cold plate mounting bracket includes a first set of mounting slots to be aligned with a second set of mounting slots disposed on a processor mounting bracket that mounts a processor onto a motherboard of the data processing system. Each of the mounting slots in the first set and the second set is configured in an asymmetric shape. The first set of mounting slots and the second set of mounting slots allow one or more mounting pins to be inserted therethrough in a first angle and to rotate from the first angle to a second angle after the insertion to interlock the cold plate with the exterior surface of the processor.

In one embodiment, each mounting pin is configured to insert through a center of a spring in order to insert through a corresponding mounting slot of the first set. The spring is compressed when the mounting pin is in a locked position to provide a force to push the cold plate against the exterior surface of the processor. A force coefficient of the spring is selected such that the force applied to the processor is optimal to allow transferring the heat to the cold plate without applying too much pressure to potentially damage the processor, at the same time, providing sufficient tightening force. The force coefficient of the spring is configured based on a design specification of the processor, such that the force applied to the processor due to a compression of the spring when the mounting pin is in the locked position is less than a maximum force can be applied to the processor specified by the design specification.

In one embodiment, each mounting pin includes a head portion, a tip portion, and a shank portion coupling the head portion to the tip portion. A cross section of the tip portion is configured to have a cross section shape conforming to the asymmetric shape of the mounting slots of the first set and the second set. A longitudinal dimension of a cross section of the tip portion is larger than a lateral dimension of each mounting slot. A lateral dimension of the cross section of the tip portion is smaller than the lateral dimension of the mounting slot. Each mounting pin is inserted through a corresponding mounting slot of the first set and the second set in a first angle, such that the longitudinal axis of the cross section of the tip portion of the mounting pin is aligned with a longitudinal axis of the corresponding mounting slots (which position is referred to as an unlocked position). When each mounting pin is rotated from the first angle to the second angle, the longitudinal axis of the cross section of the tip portion of the mounting pin is not aligned with the longitudinal axis of the corresponding mounting slots (which position is referred to as a locked position).

In one embodiment, each mounting pin in a locked position allows the tip portion and the head portion of the mounting pin to lock a cold plate mounting bracket of a corresponding cold plate and a processor mounting bracket of a corresponding processor together. At least the shank portion of each mounting pin is inserted through the spring. The spring is compressed between the head portion and the cold plate mounting bracket when the mounting pin is inserted through the mounting slots of the first set and second set. When the mounting pin is in the locked position, the tip portion of the mounting pin prevents the mounting pin from being retracted or removed from the mounting slot of the processor mounting bracket. Meanwhile, the spring (compressed between the head of the mounting pin and the cold plate mounting bracket) pulls the tip portion against the processor mounting bracket to interlock with each other. In one embodiment, the asymmetric shape of each mounting slot is an ellipse shape or a rectangular shape.

According to another aspect of the invention, an electronic rack used in a data center includes a rack liquid supply line, a rack liquid return line, and a stack of server blades coupled to the rack cooling liquid supply line and the rack cooling liquid return line. Each server blade contains one or more data processing systems. Each server blade includes one or more processors or other devices each attached to a cooling module assembly. Each cooling module assembly can be implemented as a cooling module assembly described above.

According to another aspect of the invention, a data center includes a room liquid supply line coupled to a cooling liquid source, a room liquid return line coupled to the cooling liquid source, and an array of electronic racks. Each of the electronic racks includes a rack liquid supply line coupled to the room liquid supply line, a rack liquid return line coupled to the room liquid return line, and a stack of server blades coupled to the rack cooling liquid supply line and the rack cooling liquid return line. Each server blade includes one or more data processing systems. Each server blade includes one or more processors or other devices each attached to a cooling module assembly. Each cooling module assembly can be implemented as a cooling module assembly described above.

Figure 1:
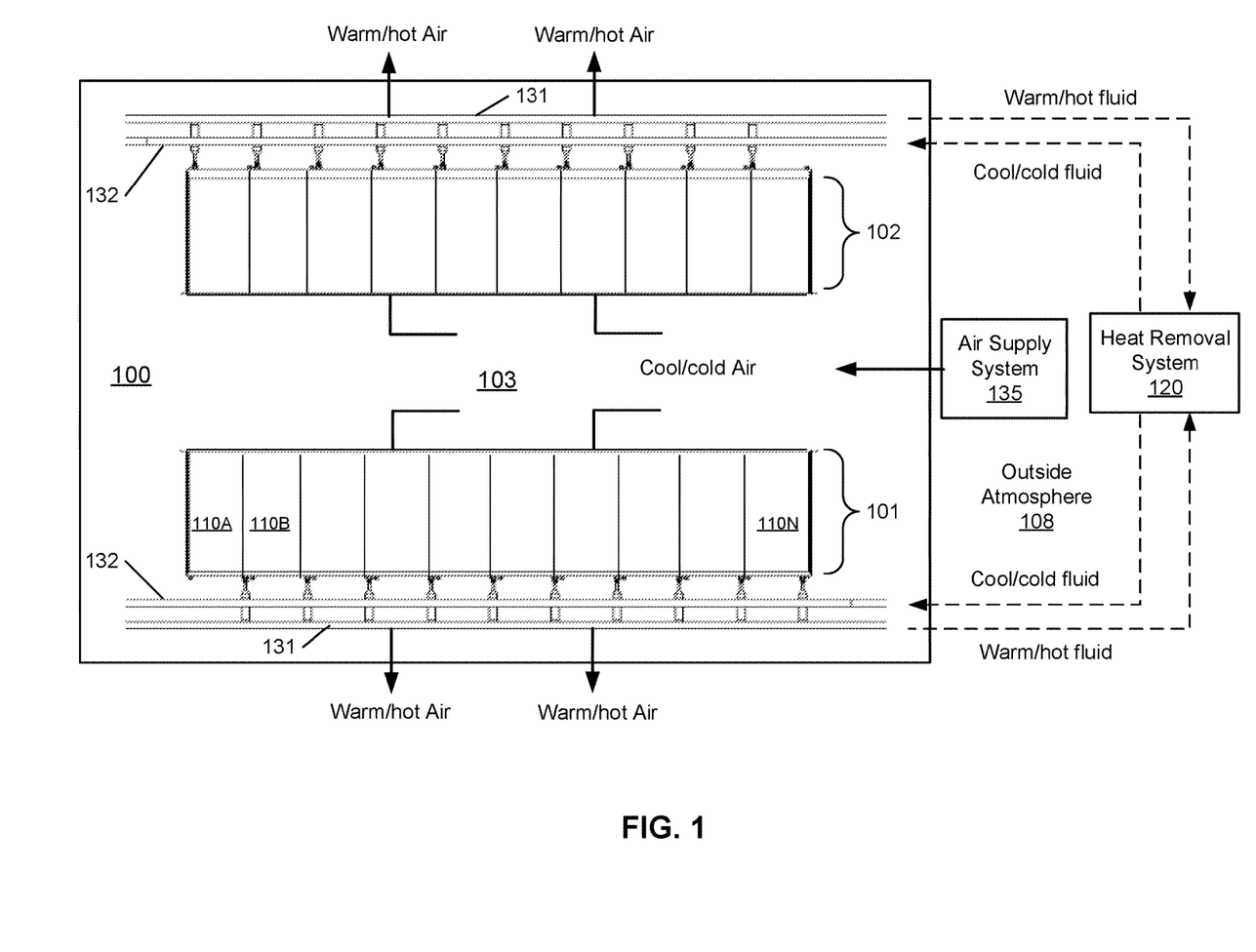
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. In addition, one or more optional cooling fans are associated with the server blades to provide air cooling to the computing nodes contained therein. Note that the heat removal system 120 may be coupled to multiple data center systems such as data center system 400.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates an airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor is removed by airflow cooling.

According to one embodiment, each of the electronic racks includes an optional rack management unit (RMU) coupled to the CDU and each of the computing nodes of the electronic rack (not shown). The RMC periodically or constantly monitors operating status of the CDU, computing nodes, and cooling fans. The operating data of the operating status may include the operating temperatures of each processor, cooling liquid, and an airflow, etc. measured at real time. Based on the operating data received from various components, the RMU performs an optimization using an optimization function to determine the optimal pump speed of a liquid pump of the CDU and optimal fan speeds of the cooling fans, such that the power consumption of the liquid pump and the cooling fans reaches minimum, while the liquid pump and the cooling fans are operating properly according to their respective specifications (e.g., the speeds of the liquid pump and cooling fans are within their respective predefined ranges).

That is, the optimization is performed at a global level by optimizing all components involved simultaneously, such that 1) the temperatures of the processors are below their respective reference temperatures, 2) the total power consumption by the liquid pump and the cooling fans reaches minimum, and 3) each of the liquid pump and cooling fans operates within their respective specification. The optimal pump speed and the optimal fan speeds are then utilized to configure the liquid pump and the cooling fans. As a result, the total power consumption by the liquid pump and the cooling fans reaches minimum while the processors of the computing nodes operate properly.

Figure 2:
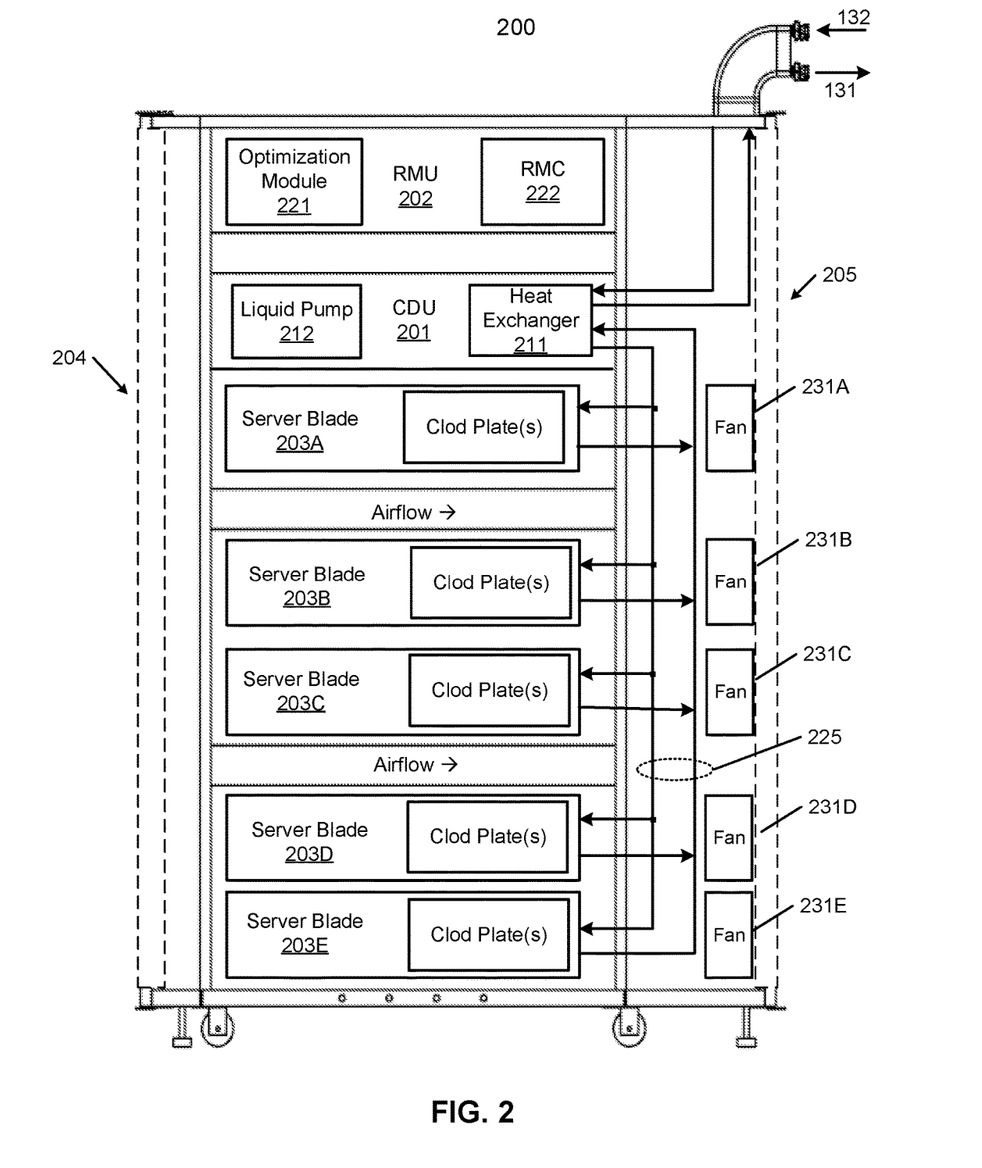
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module is associated with the server blade. In this embodiment, fan modules 231A-231E, collectively referred to as fan modules 231, are associated with server blades 203A-203E respectively. Each of the fan modules 231 includes one or more cooling fans. Fan modules 231 may be mounted on the backends of server blades 203 or on the electronic rack to generate airflows flowing from frontend 204, traveling through the air space of the sever blades 203, and existing at backend 205 of electronic rack 200.

In one embodiment, CDU 701 mainly includes heat exchanger 711, liquid pump 712, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 further includes optional RMU 202 configured to provide and manage power supplied to servers 203, fan modules 231, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and fan modules 231. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of fan modules 231 are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules 231 to control the speed of each cooling fan of the fan modules 231, which in turn control the airflow rates of the fan modules 231. Note that each of fan modules 231 may be individually controlled with its specific optimal fan speed, and different fan modules and/or different cooling fans within the same fan module may have different optimal fan speeds.

Figure 3:
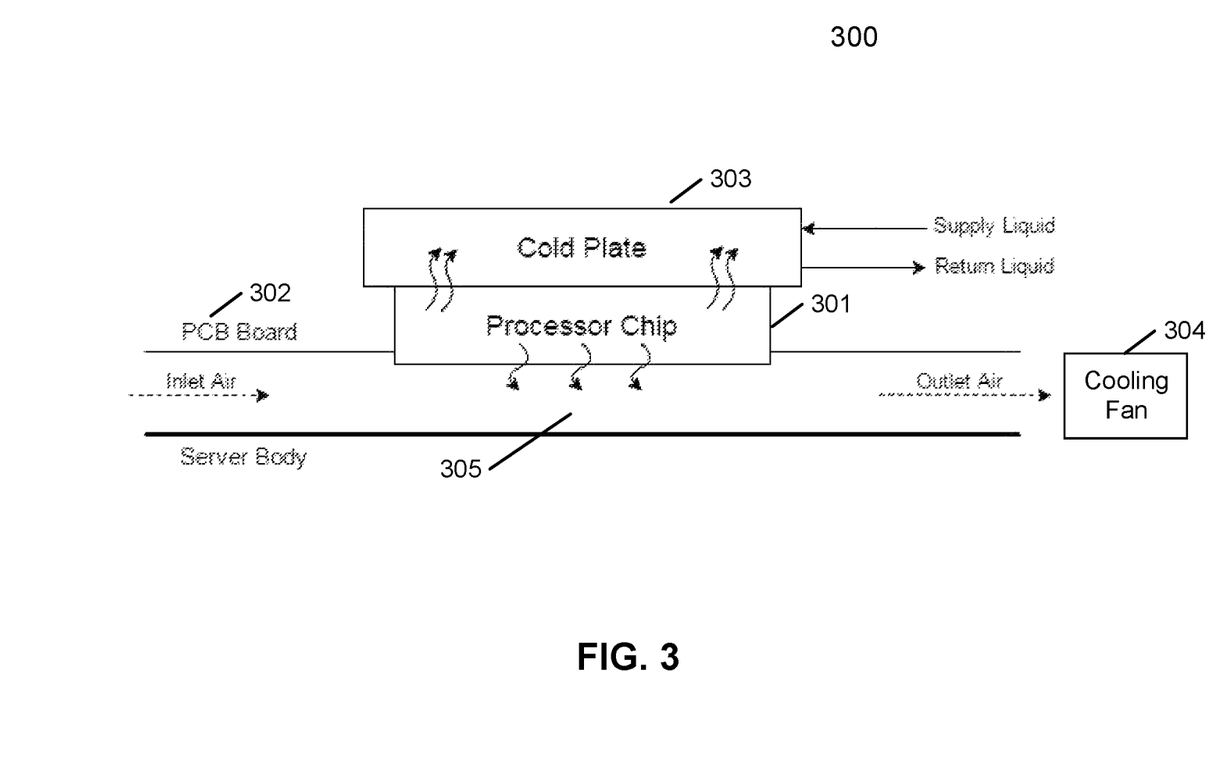
FIG. 3 is a block diagram illustrating an example of an electronic rack according to another embodiment.

FIG. 3 is a block diagram illustrating a processor cold plate configuration according to one embodiment. The processor/cold plate structure 400 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line 132 and liquid return line 131. A portion of the heat generated by processor 301 is removed by the cooling liquid via cold plate 303. The remaining portion of the heat enters into air space 305 underneath, which may be removed by an airflow generated by cooling fan 304.

Figure 4:
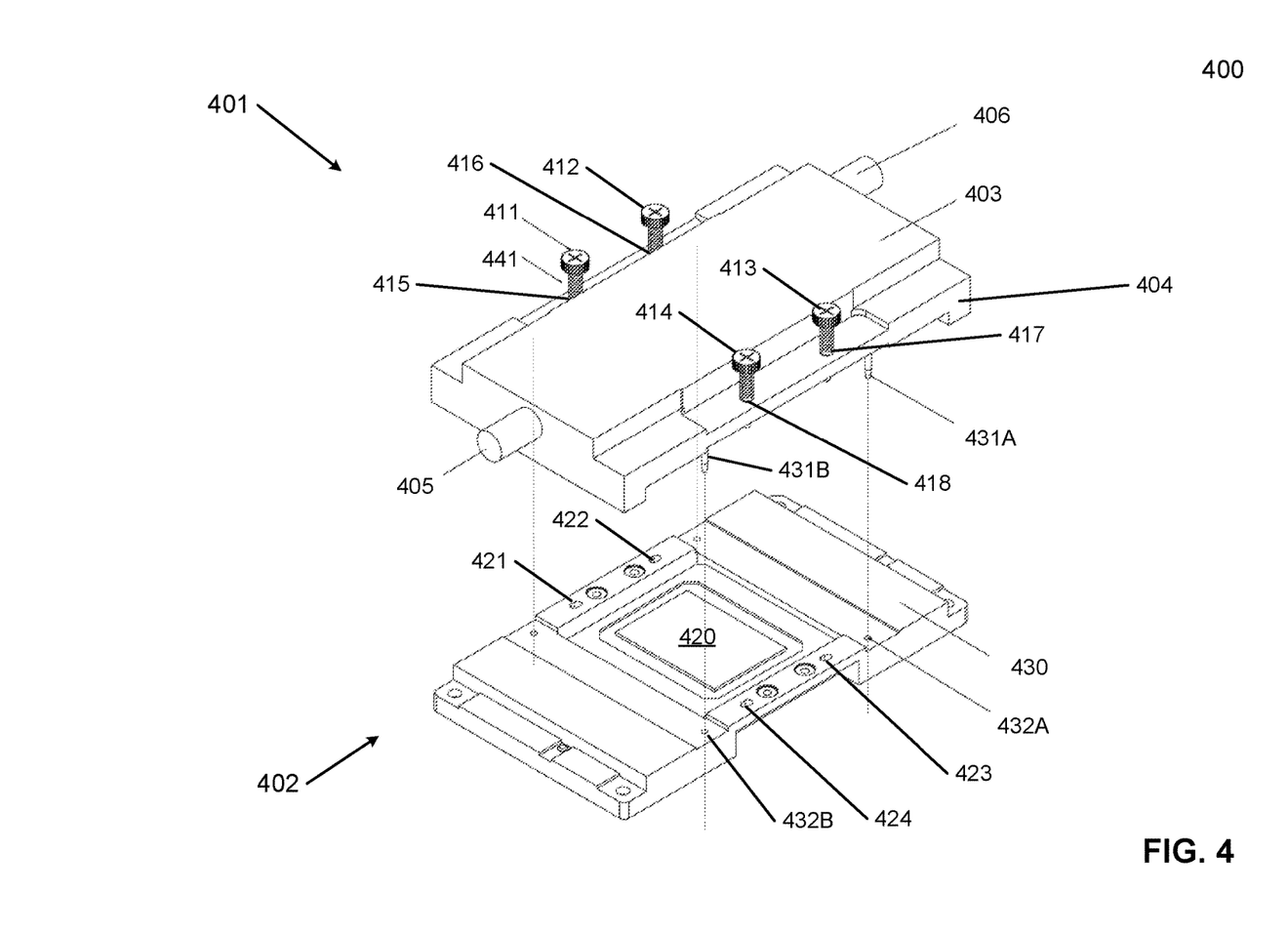
FIG. 4 shows an exploded perspective view of a cold plate configuration according to one embodiment.

FIG. 4 shows a top perspective view of a cold plate configuration according to one embodiment. Cold plate configuration 400 may represent cold plate 303 and processor 301 of FIG. 3. Referring to FIG. 4, cold plate configuration 400 includes a cold plate assembly 401 and a processor assembly 402, where the cold plate assembly 401 can be mounted or attached to an exterior surface of the processor assembly 402 to receive and remove the heat generated from a processor positioned in the processor assembly 402 using cooling liquid flowing within the cold plate assembly 401. Cold plate assembly 401 includes a cold plate 403 disposed on a cold plate mounting bracket 404. Element 403 may be referred to as a cold plate cover while element 404 may be referred to as a cold plate base, which when positioned together, encloses a cold plate therein. The cold plate design can be configured in a variety of configurations or designs, which will not be described in details herein.

A heat sink is a passive heat exchange device that transfers the heat generated by an electronic or a mechanical device to a fluid medium, often air or a liquid coolant, where it is dissipated away from the device, thereby allowing regulation of the device's temperature at optimal levels. In computers, heat sinks are used to cool central processing units (CPUs) or graphics processors (GPUs). A heat sink transfers thermal energy from a higher temperature device to a lower temperature fluid medium. The fluid medium is frequently air, but can also be water, refrigerants or oil. If the fluid medium is water or other type of heat transfer fluids, the heat sink is frequently called a cold plate. Throughout this application, the terms of a cold plate and a heat sink are interchangeable terms for the purpose of illustration.

In one embodiment, cold plate 403 includes a liquid distribution channel or tube therein (not shown) to distribute cooling liquid to exchange heat carried by cold plate 403, where the heat was exchanged from processor 420 of processor assembly 402. The liquid distribution channel includes an ingress port or inlet 405 to be coupled to a liquid supply line (e.g., a rack liquid supply line) to receive the cooling liquid from a cooling liquid source. The liquid distribution channel further includes an egress port or outlet 406 to be coupled to a liquid return line (e.g., a rack liquid return line) to return the cooling liquid carrying the exchanged heat back to the cooling liquid source.

Figure 6:
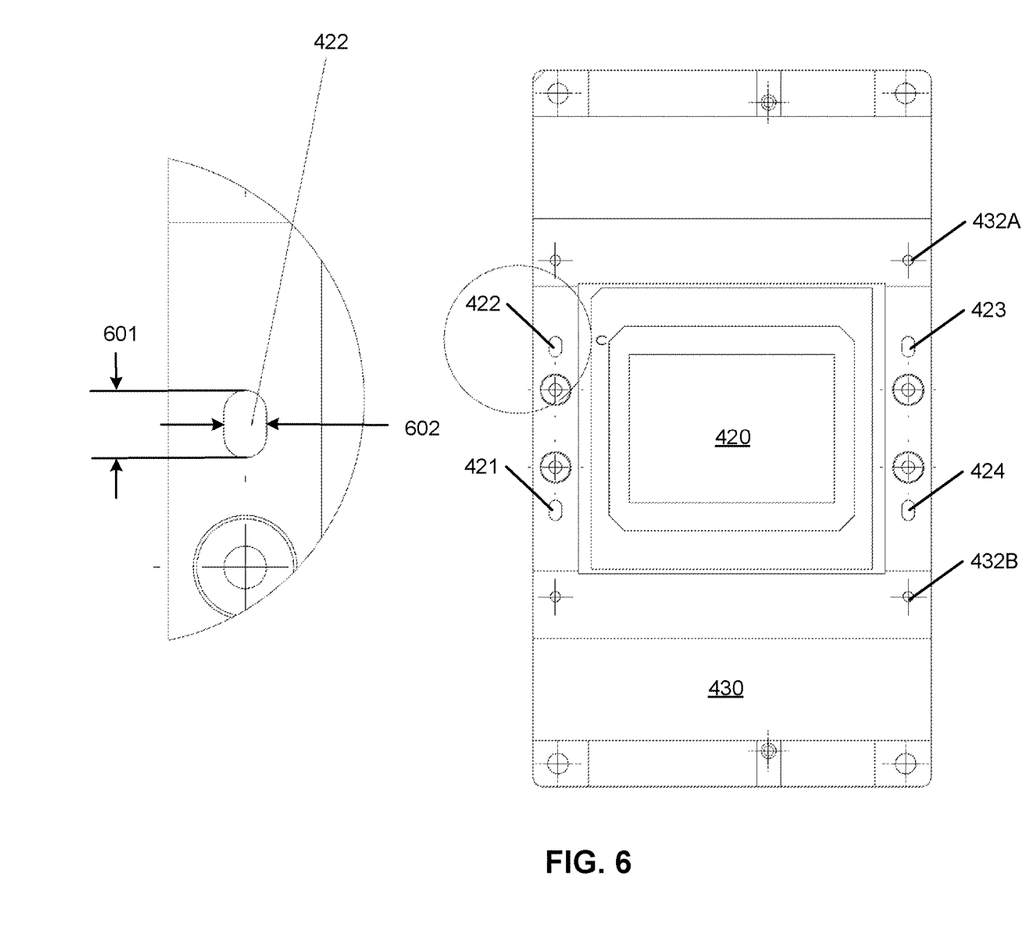
FIG. 6 shows a bottom view of a cold plate configuration according to one embodiment.

In addition, according to one embodiment, cold plate mounting bracket 404 includes a first set of mounting slots (also referred to as mounting holes) evenly disposed on the edges of cold plate mounting bracket 404. In this example, mounting slots 417-418 are disposed on one edge of cold plate mounting bracket 404, while there are other mounting slots disposed on the opposing edge of cold plate mounting bracket 404 such as mounting slots 415-416 as shown in FIG. 6. In one embodiment, same number of mounting slots is disposed on each side of the cold plate mounting bracket 404. Although there are four mounting slots as shown in this example, two for each edge, more or fewer mounting slots may also be implemented. In one embodiment, each of the mounting slots is in an asymmetric shape, such as, for example, an ellipse shape or rectangular shape.

Figure 5A:
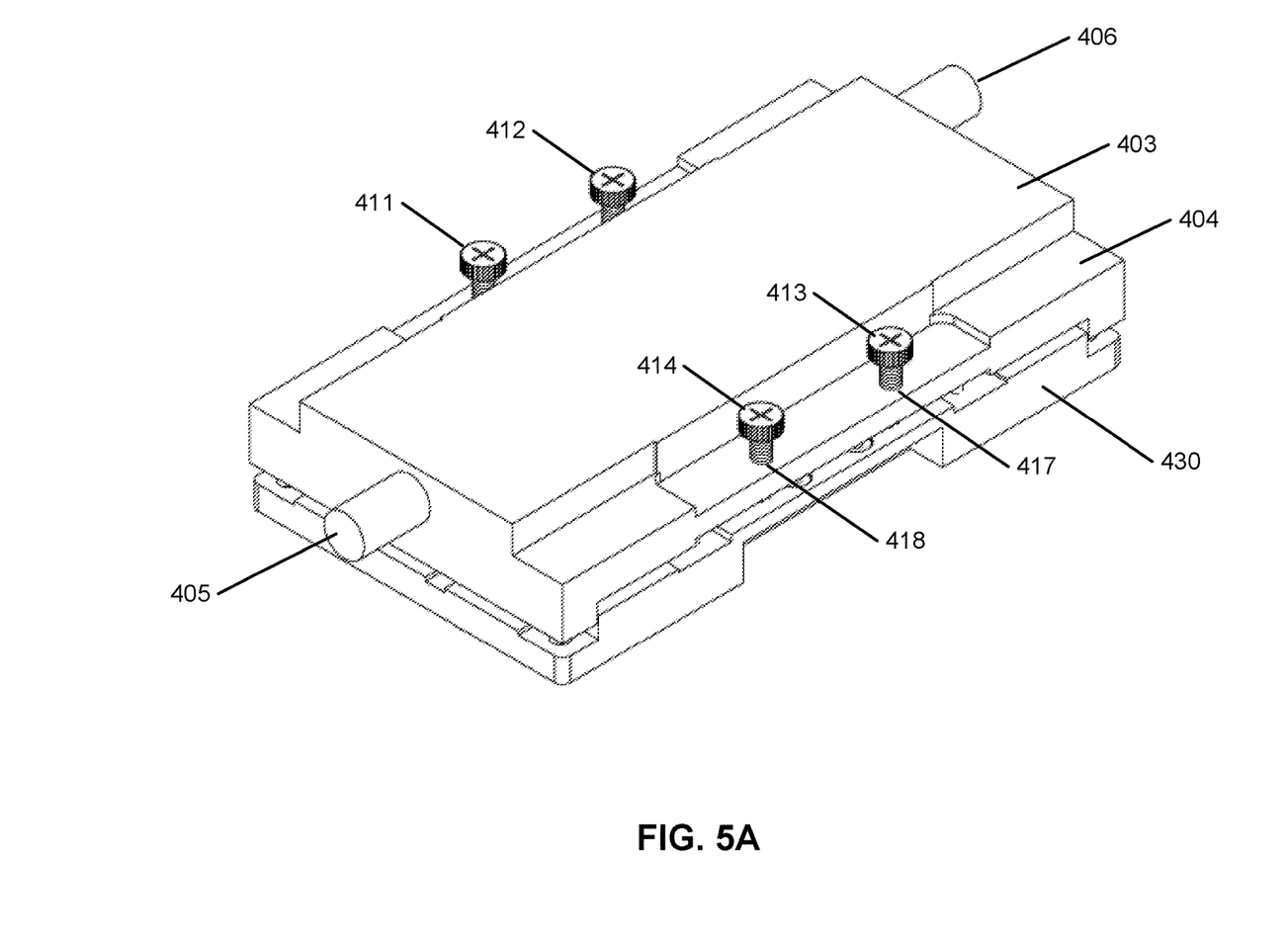
FIGS. 5A and 5B show top and bottom perspective view of a cold plate configuration according to certain embodiments.
Figure 5B:
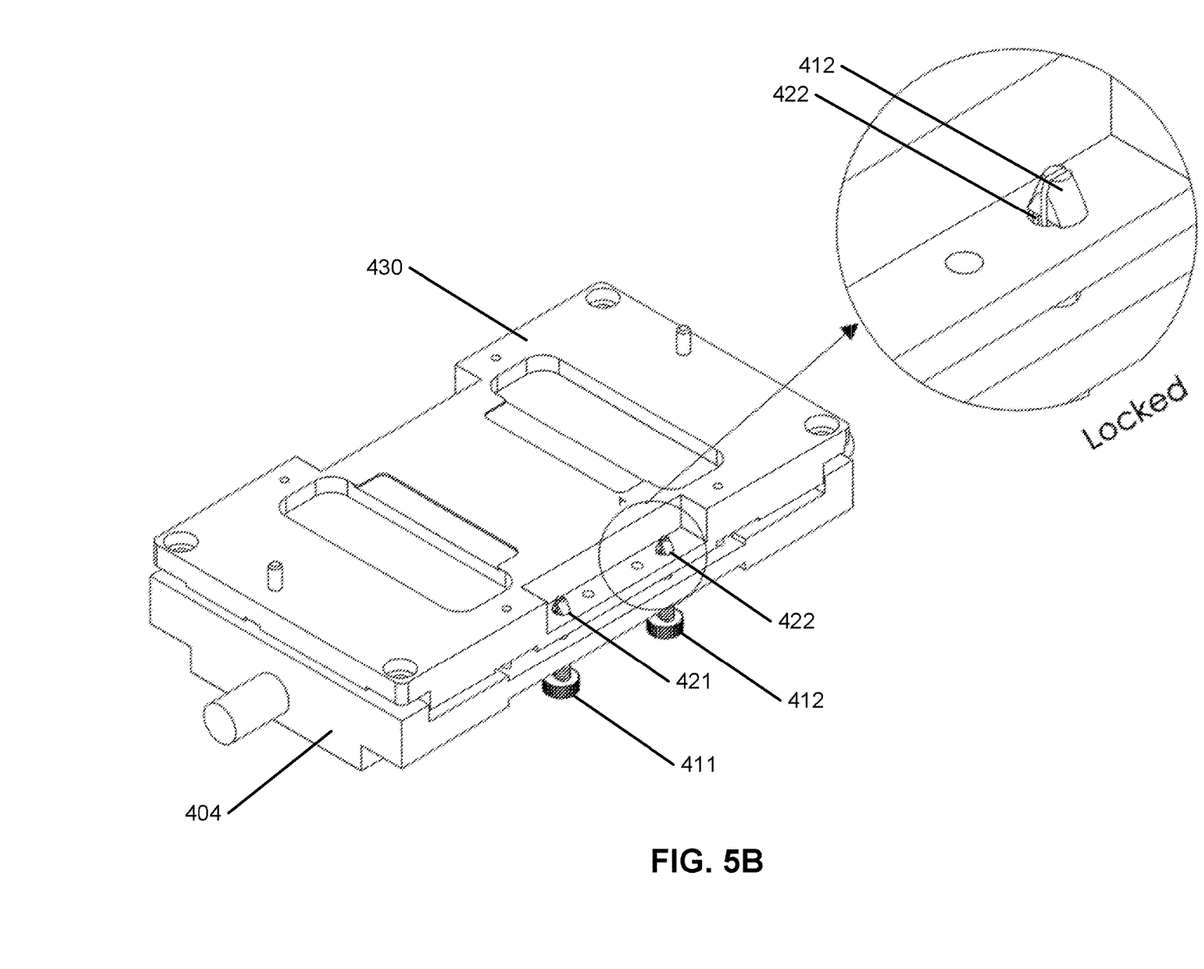

The first set of mounting slots 415-418 are aligned with a second set of mounting slots 421-424 when cold plate assembly 401 is mounted onto processor assembly 402 by aligning guide pins 431A-431B with guide pin holes 432A-432B, for example, as shown in FIG. 5A in a top perspective view and FIG. 5B in a bottom perspective view. Once the first set of mounting slots are aligned with the second set of mounting slots, a mounting pin can be inserted through each of the aligned mounting slots. In this example, mounting pins 411-414 can be inserted through mounting slots 415-418 of cold plate mounting bracket 404 and mounting slots 421-424 of processor mounting bracket 430 respectively.

According to one embodiment, each mounting pin is inserted through the center of a spring, such as spring 441, before entering the corresponding mounting slot. A spring is an elastic object that stores mechanical energy. Springs are typically made of spring steel. When a conventional spring, without stiffness variability features, is compressed or stretched from its resting position, it exerts an opposing force approximately proportional to its change in length (this approximation breaks down for larger deflections). The rate or spring constant or spring coefficient of a spring is the change in the force it exerts, divided by the change in deflection of the spring, designed to operate with a compression load, so the spring gets shorter as the load is applied to it:

$$F = -kx$$

where x is the displacement vector–the distance and direction the spring is deformed from its equilibrium length; F is the resulting force vector–the magnitude and direction of the restoring force the spring exerts; and k is the force coefficient or force constant of the spring, a constant that depends on the spring's material and construction.

Referring back to FIG. 4, the diameter of the spring coil of the spring is larger than at least the smallest dimension of a mounting slot, such that the spring is prevented from entering the mounting slot. The diameter of the spring coil is also smaller than a head of the mounting pin, such that the spring is prevented from being removed while the mounting pin is inserting into the mounting slot. When the mounting pin enters a mounting slot, the spring is compressed to provide proper mounting pressure on the cold plate mounting bracket 404 to push the cold plate towards the processor mounting bracket 430. The spring of the mounting pin is compressed by the head of the mounting pin and the cold plate mounting bracket when the mounting pin enters the mounting slot. FIGS. 5A-5B and 6 show a top perspective view, a bottom perspective view, and a top view of a cold plate attached to a processor according to certain embodiments.

Figure 7A:
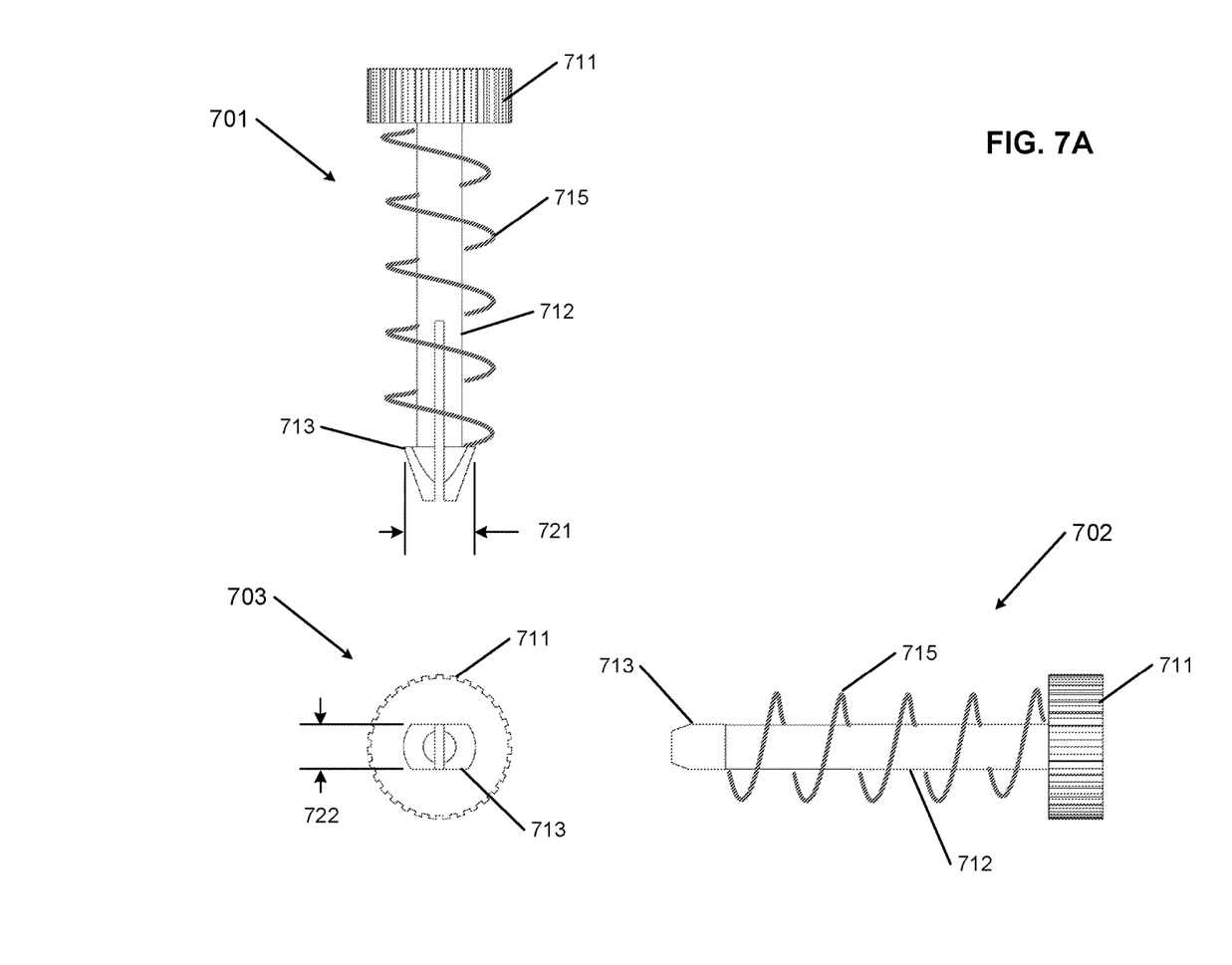
FIGS. 7A and 7B show an example of a mounting pin according to one embodiment.
Figure 7B:
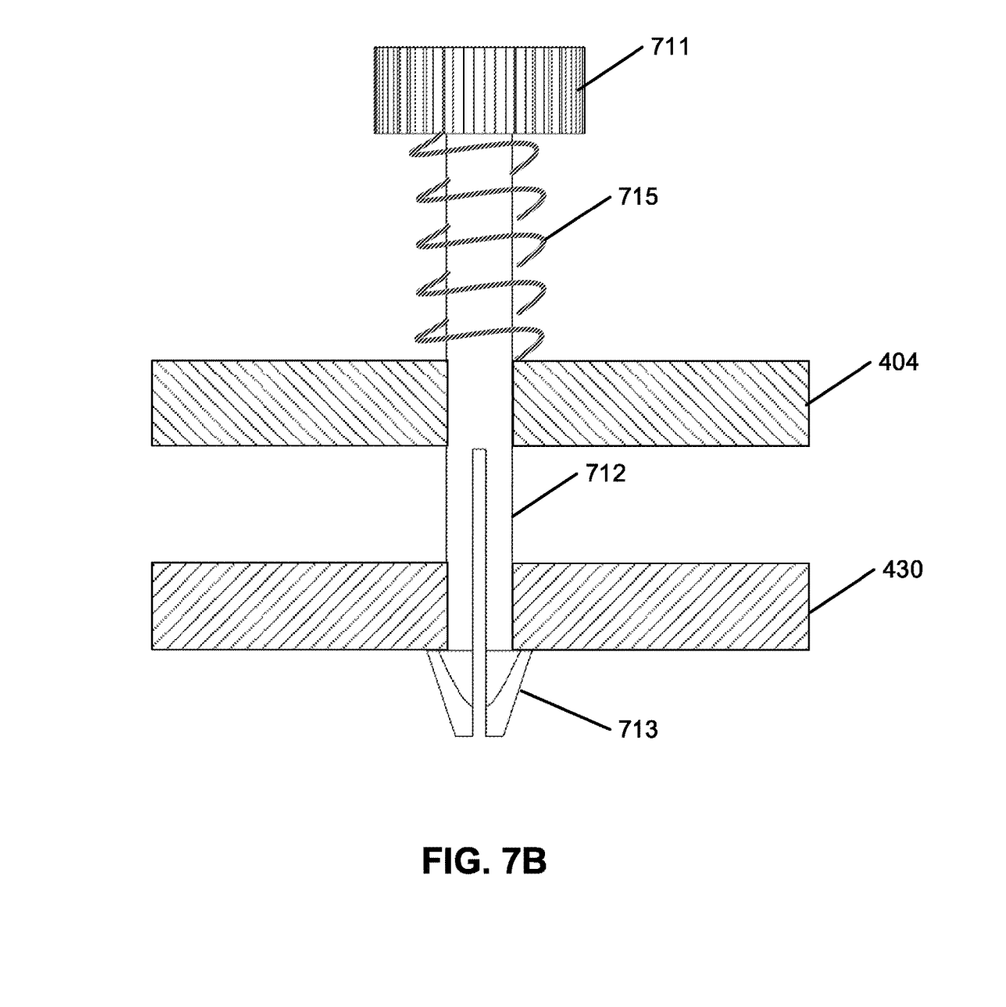

FIGS. 7A and 7B are block diagrams illustrating an example of a mounting pin configuration according to one embodiment. Referring to FIG. 7A, a mounting pin includes a head portion 711, a shank portion 712, and a tip portion 713, as shown in a first side view 701, a second side view 702, and a cross view or bottom view 703. The cross section of head portion 711 and shank portion 712 may be in a relatively circle shape. The size or diameter of head portion 711 is designed such that it is suitable for being grabbed or held on by fingers of an operator to push, pull, and rotate the mounting pin. The size or diameter of shank portion 712 is smaller than the size of any of the mounting slots, while the size or diameter of head portion 711 is larger than the size of any mounting slot. As a result, the shank portion 712 can go through a mounting slot while the head portion 711 is blocked as shown in FIG. 7B.

According to one embodiment, as shown in cross view 703, the cross section of tip portion 713 is in an asymmetric shape. Particularly, the shape of the cross section of tip portion 713 is relatively conforming to the shape of a mounting slot. For example, if the shape of the mounting slot is in an ellipse or rectangular shape, the shape of the cross section of the tip portion is significantly in an ellipse or rectangular shape respectively. As a result, a mounting pin can only insert through a mounting slot in a particular angle or orientation that is aligned with the angle or orientation associated with the mounting slot.

In one embodiment, a longer dimension 721 (e.g., along longitudinal axis) of the cross section of tip portion 713 is larger than a shorter dimension of a mounting slot (e.g., dimension 602 of mounting slot 422 of FIG. 6) and smaller than a longer dimension of the mounting slot (e.g., dimension 601 of mounting slot 422). A shorter dimension 722 (e.g., along lateral axis) of the cross section of tip portion 713 is smaller than the shorter dimension of the mounting slot. As a result, the mounting pin can only insert through the mounting slot on a first angle or orientation that is aligned with the shape of the mounting slot.

As described above, the diameter of the spring coil of spring 715 is larger than at least the shorter dimension of the mounting slot. As a result, as shown in FIG. 7B, when the mounting pin is inserted through the mounting slot via a first angle, for example, by pressing a finger of an operator and pushing downwardly, spring 715 is compressed between head portion 711 and cold plate mounting bracket 404. Note that the tip portion 713 can only go through the mounting slot when its longitudinal axis is aligned with the longitudinal axis of the mounting slot. Once tip portion 713 goes through a mounting slot across both the cold plate mounting bracket 404 and processor mounting bracket 430, the tip portion 713 can be turned horizontally from the first angle to a second angle to interlock the cold plate mounting bracket 404 and processor mounting bracket 430 together. In one embodiment, the difference between the first angle and the second angle is approximately 90 degrees. For example, an operator can simply use fingers holding the head portion 711 to turn the mounting pin from the first angle to the second angle without requiring any tool. Alternatively, the operator can use a screw driver to turn the mounting pin to different angles or orientations.

When the tip portion 713 is positioned along the second angle, the mounting pin is referred to as in a locked position. When the mounting pin is in a locked position, the longitudinal axis of the cross section of the tip portion 713 is no longer aligned with the longitudinal axis of the mounting slot, as shown in FIG. 5B and FIG. 7B. Meanwhile, the spring 715 compressed by head portion 711 and the cold plate mounting bracket 404 due to the locked position of tip portion 713 continues applying pressure to push the cold plate mounting bracket 404 and processor mounting bracket 430 towards each other. As a result, the tip portion 713 is prevented from being retracted through the mounting slot, which keeps the cold plate mounting bracket 404 and processor mounting bracket 430 interlocked together.

Figure 8:
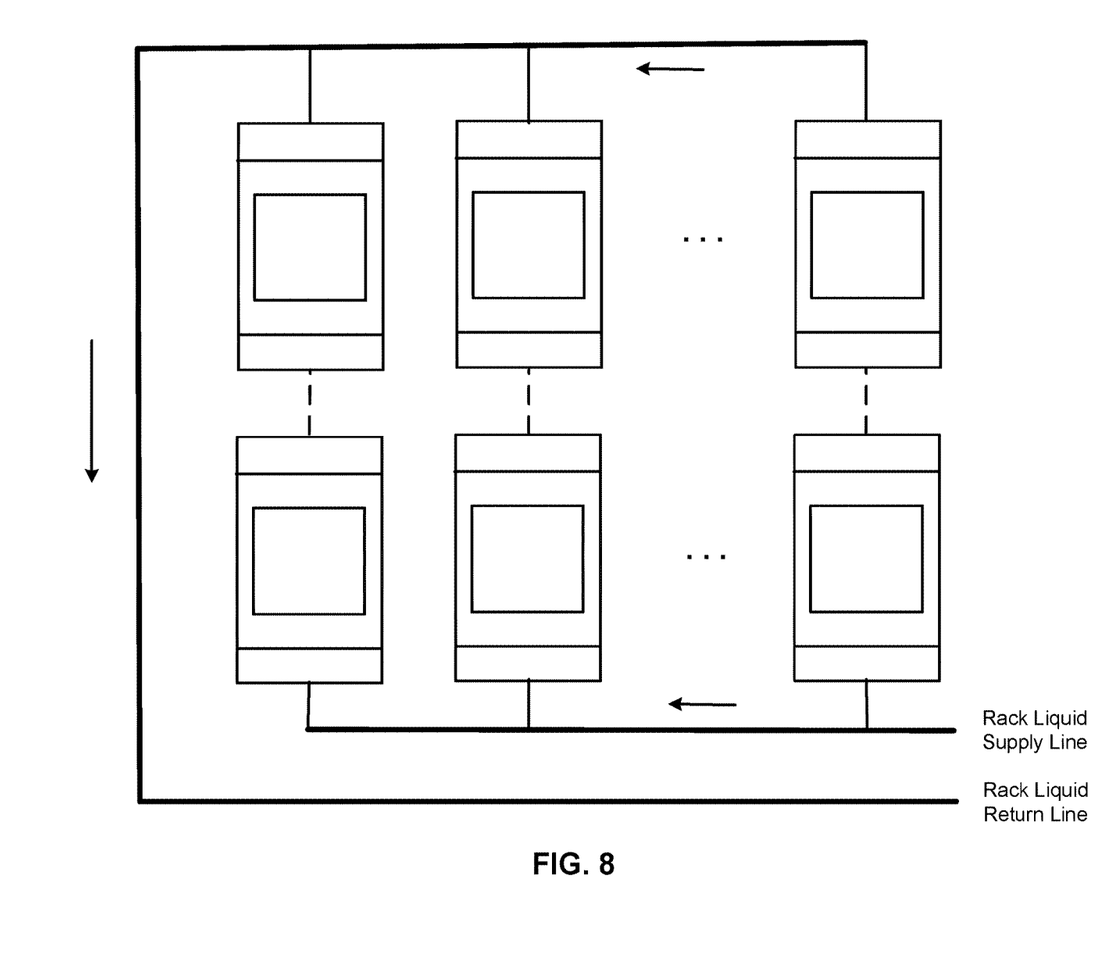
FIG. 8 shows an example of a server blade and cooling module with multiple cold units assembled according to one embodiment.

According to one embodiment, spring 715 is designed with a force coefficient (also referred to as a force constant or spring constant) such that it provides a proper range of pressure that is greater than a first predetermined threshold designed to provide sufficient pressure to cause the cold plate mounting bracket 404 in good contact with a surface of the processor for heat transfer. In addition, the pressure is less than a second predetermined threshold that corresponds to a maximum pressure the processor allows without causing damage to the processor. Similarly, when there is a need to disassemble the package, one can simply turn the mounting pin from the second angle back to the first angle, and mounting pin can be retracted and removed through the mounting slot. Thereafter, the cold plate assembly can be separated from the processor assembly. Note that a single server blade can contain multiple cold plate assemblies attached with multiple processor assemblies, and some of them may be cascaded together by daisy chaining their respective liquid distribution channels, as shown in FIG. 8.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling module assembly for cooling a processor of a data processing system in an electronic rack of a data center, the cooling module assembly comprising:
    a cold plate to be positioned adjacent to an exterior surface of a processor to receive heat radiated from the processor;
    a liquid distribution channel formed within the cold plate to distribute a cooling liquid through the cold plate to exchange the heat carried by the cold plate, wherein the liquid distribution channel includes
        an ingress port to be coupled a liquid supply line to receive the cooling liquid from an external liquid source, wherein the ingress port is disposed on a first edge of the cold plate, and
        an egress port to be coupled to a liquid return line to return the cooling liquid having the exchanged heat back to the external liquid source, wherein the egress port is disposed on a second edge of the cold plate opposite to the first edge; and
    a cold plate mounting bracket attached to the cold plate to mount the cold plate onto the external surface of the processor, wherein the cold plate mounting bracket includes a first set of mounting slots to be aligned with a second set of mounting slots disposed on a processor mounting bracket that mounts the processor onto a motherboard of the data processing system,
    wherein the first set of mounting slots is disposed on a third edge of the cold plate mounting bracket and the second set of mounting slots is disposed on a fourth edge of the cold plate mounting bracket opposite to the third edge, wherein the third edge and the fourth edge are different edges than the first and second edges,
    wherein the third edge of the cold plate mounting bracket further comprises a first set of one or more aligning guide pins disposed thereon and extended downwardly, and the fourth edge of the cold plate mounting bracket further comprises a second set of one or more aligning guide pins disposed thereon and extended downwardly,
    wherein when the cold plate mounting bracket together with the cold plate is mounted onto the processor mounting bracket, the aligning guide pins of the first set and second set are inserted into corresponding guide pin holes disposed on the processor mounting bracket, such that the mounting slots of the cold plate mounting bracket are aligned with the mounting slots of the processor mounting bracket,
    wherein the first set of mounting slots and the second set of mounting slots allow one or more mounting pins to be inserted therethrough in a first angle and to rotate from the first angle to a second angle after the insertion to interlock the cold plate with the exterior surface of the processor;
    wherein each mounting pin is configured to insert through a center of a spring in order to insert through a corresponding mounting slot of the first set such that the spring is compressed when the mounting pin is in a locked position, thereby providing a force to push the cold plate mounting bracket and the processor mounting bracket together so as to provide adequate contact between the cold plate and the processor.

2. The cooling module assembly of claim 1, wherein a force coefficient of the spring is selected such that the force applied to the processor is greater than a first predetermined threshold and less than a second predetermined threshold to allow transferring the heat to the cold plate without applying too much pressure to potentially damage the processor.

3. The cooling module assembly of claim 2, wherein the force coefficient of the spring is configured based on a design specification of the processor, such that the force applied to the processor due to a compression of the spring when the mounting pin is in the locked position is less than a maximum force represented by the second predetermined threshold that can be applied to the processor specified by the design specification.

4. The cooling module assembly of claim 1, wherein each mounting pin comprises:
    a head portion;
    a tip portion; and a shank portion coupling the head portion to the tip portion, wherein a cross section of the tip portion is configured to have a cross section shape conforming to an asymmetric shape of the mounting slots of the first set and the second set.

5. The cooling module assembly of claim 4, wherein a longitudinal dimension of the tip portion is larger than a lateral dimension of each mounting slot, and wherein a lateral dimension of the tip portion is smaller than the lateral dimension of the mounting slot.

6. The cooling module assembly of claim 5, wherein each mounting pin is inserted through corresponding mounting slots of the first set and the second set in a first angle, such that a longitudinal axis of the mounting pin is aligned with a longitudinal axis of the corresponding mounting slots, and wherein when mounting pin is rotated from the first angle to the second angle, the longitudinal axis of the mounting pin is not aligned with the longitudinal axis of the corresponding mounting slots.

7. The cooling module assembly of claim 6, wherein each mounting pin in a locked position allows the tip portion and the head portion of the mounting pin to lock the cold plate mounting bracket of a corresponding cold plate and the processor mounting bracket of the corresponding processor together.

8. The cooling module assembly of claim 4, wherein at least the shank portion of each mounting pin is inserted through the spring, and wherein the spring is compressed between the head portion and the cold plate mounting bracket when the mounting pin is inserted through the mounting slots of the first set and second set.

9. The cooling module assembly of claim 8, wherein when the mounting pin is in the locked position, the tip portion of the mounting pint prevents the mounting pin from being retracted from the mounting slot of the processing mounting bracket, while the spring pulls the tip portion against the processor mounting bracket to interlock with each other.

10. The cooling module assembly of claim 4, wherein the asymmetric shape of each mounting slot is an ellipse shape or a rectangular shape.

11. An electronic rack of a data center, comprising:
a rack liquid supply line;
a rack liquid return line; and
a stack of server blades coupled to the rack cooling liquid supply line and the rack cooling liquid return line, each server blade representing a data processing system, wherein each server blade includes one or more processors each attached to a cooling module assembly, wherein each cooling module assembly includes
  a cold plate to be positioned adjacent to an exterior surface of a processor to receive heat radiated from the processor,
  a liquid distribution channel formed within the cold plate to distribute a cooling liquid through the cold plate to exchange the heat carried by the cold plate, wherein the liquid distribution channel includes
    an ingress port to be coupled the rack liquid supply line to receive the cooling liquid from an external liquid source, wherein the ingress port is disposed on a first edge of the cold plate, and
    an egress port to be coupled to the rack liquid return line to return the cooling liquid having the exchanged heat back to the external liquid source, wherein the egress port is disposed on a second edge of the cold plate opposite to the first edge, and
  a cold plate mounting bracket attached to the cold plate to mount the cold plate onto the external surface of the processor, wherein the cold plate mounting bracket includes a first set of mounting slots to be aligned with a second set of mounting slots disposed on a processor mounting bracket that mounts the processor onto a motherboard of the data processing system,
  wherein the first set of mounting slots is disposed on a third edge of the cold plate mounting bracket and the second set of mounting slots is disposed on a fourth edge of the cold plate mounting bracket opposite to the third edge, wherein the third edge and the fourth edge are different edges than the first and second edges,
  wherein the third edge of the cold plate mounting bracket further comprises a first set of one or more aligning guide pins disposed thereon and extended downwardly, and the fourth edge of the cold plate mounting bracket further comprises a second set of one or more aligning guide pins disposed thereon and extended downwardly,
  wherein when the cold plate mounting bracket together with the cold plate is mounted onto the processor mounting bracket, the aligning guide pins of the first set and second set are inserted into corresponding guide pin holes disposed on the processor mounting bracket, such that the mounting slots of the cold plate mounting bracket are aligned with the mounting slots of the processor mounting bracket,
  wherein the first set of mounting slots and the second set of mounting slots allow one or more mounting pins to be inserted therethrough in a first angle and to rotate from the first angle to a second angle after the insertion to interlock the cold plate with the exterior surface of the processor;
  wherein each mounting pin is configured to insert through a center of a spring in order to insert through a corresponding mounting slot of the first set such that the spring is compressed when the mounting pin is in a locked position, thereby providing a force to push the cold plate mounting bracket and the processor mounting bracket together so as to provide adequate contact between the cold plate and the processor.

12. The electronic rack of claim 11, wherein a force coefficient of the spring is selected such that the force applied to the processor is greater than a first predetermined threshold and less than a second predetermined threshold to allow transferring the heat to the cold plate without applying too much pressure to potentially damage the processor.

13. The electronic rack of claim 12, wherein the force coefficient of the spring is configured based on a design specification of the processor, such that the force applied to the processor due to a compression of the spring when the mounting pin is in the locked position is less than a maximum force represented by the second predetermined threshold that can be applied to the processor specified by the design specification.

14. The electronic rack of claim 11, wherein each mounting pin comprises:
a head portion;
a tip portion; and
a shank portion coupling the head portion to the tip portion, wherein a cross section of the tip portion is configured to have a cross section shape conforming to an asymmetric shape of the mounting slots of the first set and the second set.

15. The electronic rack of claim 14, wherein a longitudinal dimension of the tip portion is larger than a lateral dimension of each mounting slot, and wherein a lateral dimension of the tip portion is smaller than the lateral dimension of the mounting slot.

16. A data center, comprising:
    a room liquid supply line coupled to a cooling liquid source;
    a room liquid return line coupled to the cooling liquid source; and
    an array of electronic racks, each of the electronic racks including
        a rack liquid supply line coupled to the room liquid supply line;
        a rack liquid return line coupled to the room liquid return line; and
        a stack of server blades coupled to the rack cooling liquid supply line and the rack cooling liquid return line, each server blade representing a data processing system, wherein each server blade includes one or more processors each attached to a cooling module assembly, wherein each cooling module assembly comprises
            a cold plate to be positioned adjacent to an exterior surface of a processor to receive heat radiated from the processor,
            a liquid distribution channel formed within the cold plate to distribute a cooling liquid through the cold plate to exchange the heat carried by the cold plate, wherein the liquid distribution channel includes
                an ingress port to be coupled the rack liquid supply line to receive the cooling liquid from the room liquid supply line, wherein the ingress port is disposed on a first edge of the cold plate, and
                an egress port to be coupled to the rack liquid return line to return the cooling liquid having the exchanged heat back to the room liquid return line, wherein the egress port is disposed on a second edge of the cold plate opposite to the first edge, and
            a cold plate mounting bracket attached to the cold plate to mount the cold plate onto the external surface of the processor, wherein the mounting bracket includes a first set of mounting slots to be assigned with a second set of mounting slots disposed on a processor mounting bracket that mounts the processor onto a motherboard of the data processing system,
        wherein the first set of mounting slots is disposed on a third edge of the cold plate mounting bracket and the second set of mounting slots is disposed on a fourth edge of the cold plate mounting bracket opposite to the third edge, wherein the third edge and the fourth edge are different edges than the first and second edges,
        wherein the third edge of the cold plate mounting bracket further comprises a first set of one or more aligning guide pins disposed thereon and extended downwardly, and the fourth edge of the cold plate mounting bracket further comprises a second set of one or more aligning guide pins disposed thereon and extended downwardly,
        wherein when the cold plate mounting bracket together with the cold plate is mounted onto the processor mounting bracket, the aligning guide pins of the first set and second set are inserted into corresponding guide pin holes disposed on the processor mounting bracket, such that the mounting slots of the cold plate mounting bracket are aligned with the mounting slots of the processor mounting bracket,
        wherein the first set of mounting slots and the second set of mounting slots allow one or more mounting pins to be inserted through via a first angle and to rotate from the first angle to a second angle, after the insertion to interlock the cold plate with the exterior surface of the processor;
        wherein each mounting pin is configured to insert through a center of a spring in order to insert through a corresponding mounting slot of the first set such that the spring is compressed when the mounting pin is in a locked position, thereby providing a force to push the cold plate mounting bracket and the processor mounting bracket together so as to provide adequate contact between the cold plate and the processor.

17. The data center of claim 16, wherein a force coefficient of the spring is selected such that the force applied to the processor is greater than a first predetermined threshold and less than a second predetermined threshold to allow transferring the heat to the cold plate without applying too much pressure to potentially damage the processor.

18. The data center of claim 17, wherein the force coefficient of the spring is configured based on a design specification of the processor, such that the force applied to the processor due to a compression of the spring when the mounting pin is in the locked position is less than a maximum force represented by the second predetermined threshold that can be applied to the processor specified by the design specification.

19. The data center of claim 16, wherein each mounting pin comprises:
    a head portion;
    a tip portion; and
    a shank portion coupling the head portion to the tip portion, wherein a cross section of the tip portion is configured to have a cross section shape conforming to an asymmetric shape of the mounting slots of the first set and the second set.

20. The data center of claim 19, wherein a longitudinal dimension of the tip portion is larger than a lateral dimension of each mounting slot, and wherein a lateral dimension of the tip portion is smaller than the lateral dimension of the mounting slot.

* * * * *